US009509442B2

(12) United States Patent
Callard et al.

(10) Patent No.: US 9,509,442 B2
(45) Date of Patent: Nov. 29, 2016

(54) SYSTEM AND METHOD FOR APRIORI DECODING

(71) Applicant: Huawei Technologies Co., Ltd., Shenzhen (CN)

(72) Inventors: Aaron James Callard, Ottawa (CA); Mohammadhadi Baligh, Ottawa (CA); Kelvin Kar Kin Au, Kanata (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 17 days.

(21) Appl. No.: 14/132,499

(22) Filed: Dec. 18, 2013

(65) Prior Publication Data

US 2014/0169797 A1 Jun. 19, 2014

Related U.S. Application Data

(60) Provisional application No. 61/738,904, filed on Dec. 18, 2012.

(51) Int. Cl.
*H04L 1/00* (2006.01)
*H03M 13/03* (2006.01)
(Continued)

(52) U.S. Cl.
CPC .......... *H04L 1/0054* (2013.01); *H03M 13/03* (2013.01); *H03M 13/356* (2013.01); *H03M 13/3723* (2013.01); *H03M 13/612* (2013.01); *H03M 13/6312* (2013.01); *H03M 13/6525* (2013.01); *H04L 1/007* (2013.01); *H04L 1/0045* (2013.01); *H04L 1/0072* (2013.01)

(58) Field of Classification Search
CPC ............ H03M 13/2957; H03M 13/4146; H03M 13/1111; H03M 13/3972; H04L 1/005; H04L 25/067; H04L 1/0045; H04W 52/146
See application file for complete search history.

(56) References Cited

U.S. PATENT DOCUMENTS 6,377,607 B1 * 4/2002 Ling ................. H03M 13/2957
375/130
2003/0093269 A1 5/2003 Attias et al.
(Continued)

FOREIGN PATENT DOCUMENTS

WO 2007021224 A1 2/2007

OTHER PUBLICATIONS

International Search Report received in Application No. PCT/US13/76224, mailed May 23, 2014, 10 pages.
(Continued)

*Primary Examiner* — Vineeta Panwalkar
(74) *Attorney, Agent, or Firm* — Slater Matsil, LLP (57) ABSTRACT

Embodiments are provided for transmitting channel information, such as control channel information, using lower resources at the transmitter combined with using apriori information associated with channel information in the decoder of the receiver. The apriori information represent predictable information that can be predicted by the receiver and is not transmitted with the channel information by the transmitter. The transmitter determines the apriori information for the channel and codes the channel information into bits and fields excluding the apriori information. Upon receiving the channel information, the receiver determines the apriori information associated in accordance with previously received information. The apriori information is then provided as probability information for input to the decoder. The decoder then decodes the received information in accordance with the apriori information.

21 Claims, 4 Drawing Sheets

(51) Int. Cl.
*H03M 13/37* (2006.01)
*H03M 13/00* (2006.01)
*H03M 13/35* (2006.01)

(56) References Cited

U.S. PATENT DOCUMENTS

| | | | | |
|---|---|---|---|---|
| 2003/0193966 | A1* | 10/2003 | Mills | H04L 1/0048 370/476 |
| 2004/0059992 | A1* | 3/2004 | Tan | H03M 13/29 714/795 |
| 2006/0222129 | A1 | 10/2006 | Hadzic et al. | |
| 2007/0186138 | A1 | 8/2007 | Yang et al. | |
| 2009/0177951 | A1 | 7/2009 | Lee et al. | |

OTHER PUBLICATIONS

Bruhn et al., "Concepts and Solutions for Link Adaptation and Inband Signaling for the GSM Speech Coding Standard", pp. 2451-2455, 1999.

Hagenauer, J., "Source-Controlled Channel Decoding, IEEE Transactions on Communications", Sep. 1995, No. 9, New York, US, pp. 2449-2457.

* cited by examiner

SYSTEM AND METHOD FOR APRIORI DECODING

This application claims the benefit of U.S. Provisional Application No. 61/738,904 filed on Dec. 18, 2012 by Aaron Callard et al. and entitled "System and Method for Apriori Control Decoding," which is hereby incorporated herein by reference as if reproduced in its entirety.

TECHNICAL FIELD

The present invention relates to the field of optical communications, and, in particular embodiments, to a system and method for utilizing apriori information to improve the decoding of predictable data.

BACKGROUND

In communications systems such as wireless communications, data is transmitted over communications channels that are assigned corresponding resources, e.g., transmission frequencies and/or time slots. A communication channel can be segmented into two portions: a payload portion that carries user or communications data, and a control portion that carries control information for managing the channels, resources, and other network condition. The control portion is typically smaller than the payload portion. Payload and control information can also be transmitted on separate or dedicated channels. The payload is intended to be processed to obtain the communications information, and the control information is used to control and manage the communications. The transmitted control information over time may substantially include redundant data, which is often repeated, while transmitted payload information can widely vary for different users and at different times. There is a need for a scheme that improves the decoding of received channel information, e.g., at a receiver, for example to save network resources and improve communications efficiency.

SUMMARY OF THE INVENTION

In accordance with an embodiment of the disclosure, a method by a receiver for utilizing apriori information in a decoder includes receiving information, and determining apriori information associated with the received information in accordance with previously received information. The apriori information is then provided as probability information for input to the decoder. The decoder then decodes the received information in accordance with the apriori information.

In accordance with another embodiment of the disclosure, a network component for utilizing apriori information comprises at least one processor including a decoder, and a non-transitory computer readable storage medium storing programming for execution by the processor. The programming includes instructions to receive information and determine apriori information associated with the received information in accordance with previously received information. The programming further includes instructions to provide apriori information as probability information for input to the decoder. The decoder is configured to decode the received information in accordance with the apriori information.

In accordance with another embodiment of the disclosure, a method by a transmitter for supporting decoding using apriori information includes determining apriori information associated with channel information. The apriori information is predicatble by a receiver of the channel information. The method further includes coding the channel information into bits and fields excluding the apriori information, and transmitting the channel information to the receiver.

In accordance with yet another embodiment of the disclosure, a network component for supporting decoding using apriori information comprises at least one processor and a non-transitory computer readable storage medium storing programming for execution by the processor. The programming includes instructions to determine apriori information associated with channel information. The apriori information is predicatble by a receiver of the channel information. The programming includes further instructions to code the channel information into bits and fields excluding the apriori information, and transmit the channel information to the receiver.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Control information, in communications systems channels, can be highly predictable. By exploiting this fact in the receivers, the amount of transmission resources to transmit this information can be significantly reduced. Specifically, the receivers can use prior knowledge of the control information (predictable information), also referred to as apriori information, in the decoder of the receiver to decode the transmitted control channel/bits. Using the apriori information reduces the need to transmit the predictable portion of the control information and thus reduces the transmission resources for the control channel/bits. System, apparatus, and method embodiments are provided herein for transmitting control information using lower resources and/or higher rates combined with using the apriori information in the decoder of the receiver.

Figure 1:
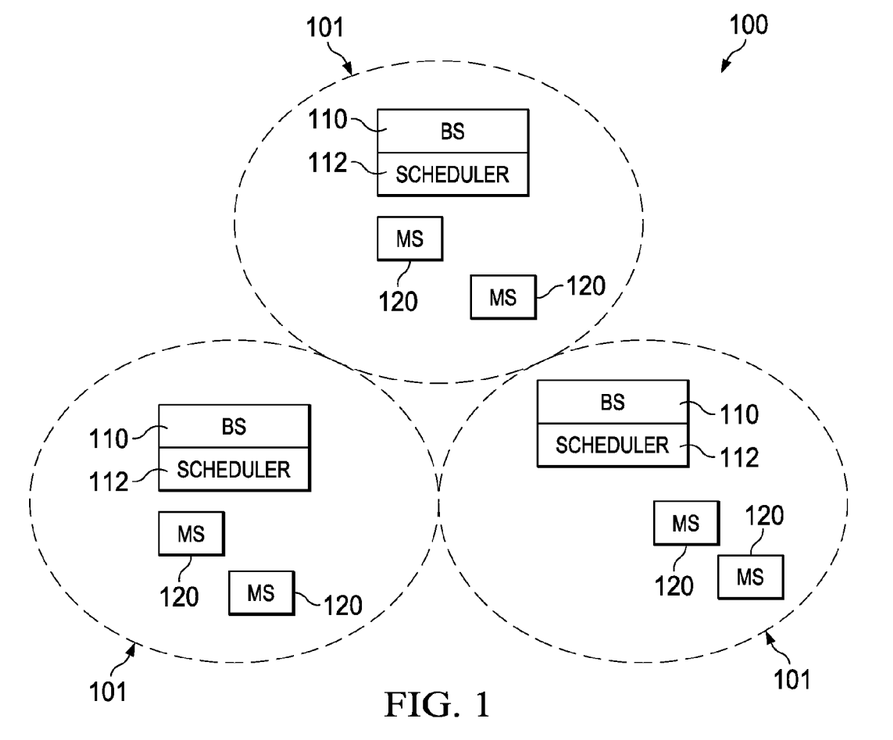
FIG. 1 illustrates an example of a wireless communications system.

FIG. 1 shows an example of a wireless communications network 100 comprising a plurality of base stations (BSs) 110 and a plurality of mobile stations (MBs) 120. The BSs 110 provide voice and/or data wireless communication services to the MSs 120. The BSs 110, which may also be referred to by other names such as access networks (ANs), access point (APs), Node-Bs, or eNBs, send downlink (DL) information to the MSs 120 and receive uplink (UL) information from the MSs 120. The BSs 110 may have wireless coverage areas referred to as cells 101 within which the MSs 120 can be served. The coverage areas or cells 101 represent the range of each BS 110 to adequately transmit data, and, while not necessarily shown, the coverage areas 101 of adjacent BSs 110 may have some overlap in order to accommodate handoffs between BSs 110 whenever a MS 120 exits one coverage area 101 and enters an adjacent coverage area 101. Each BS 110 also includes a scheduler 112 for allocating radio resources to transmit data to the MSs 120.

In an embodiment, the transmitting components of a communications system, such as in the network 100, are configured to increase the transmission rate of control information that can be predicted at the receivers. As such, a reduce number of bits is used to transmit the control information, which saves or improves resource usage. For instance, a transmitter may determine when or whether control information to be transmitted is predictable. If the control information is predictable, then the transmitter uses a higher modulation and coding scheme (MCS) to transmit the control information with reduced bits. Thus, a rate of information bits to transmitted bits that is higher than 1 can be achieved when transmitting predictable control information. In one embodiment, this is analogous to source compression but is performed using the FEC code and parity bits instead of Huffman coding, or the like. For example, the more predictable information in the control channel/bits, the higher the rate that can be achieved. Respectively, the receiver on the other side implements the suitable MCS or decoding scheme to decode the reduced number of received bits and retrieve the complete control information. Specifically, the decoder at the receiver is fed apriori information. The apriroi information correspond to probability or likelihood values for the removed bits (predictable bits).

In an exemplary scenario, a user that has a signal range of 17 dB is unlikely to receive a quadrature phase-shift keying QPSK rate of 1/12. Thus, the predictable control information can be transmitted at a reduce bit size by removing the predictable information. At the receiver, for each option of possible value to be predicted, a probability can be assigned. This can be done by looking at any suitable combination of historical data and other information, such as feedback. These probabilities can be used as apriori information in decoding the control information. The apriori information is used in the decoder to increase the effective coding rate by reducing the amount of transmitted information bits from 1 per bit to H(p), the entropy of that bit. Practically, as there is correlation between bits (e.g., MCS is encoded in 5 bits), a product code can be used to translate the apriori information bits into apriori information that the decoder can use.

In an embodiment, at scheduling, the transmitting BS or UE calculates the information it sends. It then calculates the MCS needed to send that data. If the data is predictable then the MCS is lower, otherwise it is higher. This could result in a rate >1, however it typically would result in a moderate increase in the effective rate. The receiving UE or BS can apply the apriori information at different levels depending on the MCS of the channel used. Different levels means that the strength in which the apriori information is applied is the apriori log likelihood ratio, e.g., 5 or 5x where x represents the confidence in the apriori information. The strength applied could be represented a linear (as above) or non-linear function (min(LLR, LLR_max)). The predictions done at the UE and BS can be 'roughly' aligned.

In an embodiment, the receiver calculates the probabilities corresponding to the transmitted control information, and applies weights to the control bits in decoding the received control information. For instance, the log likelihood ratios (LLRs) can be added to the apriori information that are used as input to the decoder. More advanced methods can be used in which correlation of bit values (e.g., the values are either 111 or 000) are exploited. For instance, a product code structure can be used in which the second product code represents the correlation values. The apriori information could be obtained in any one of various suitable ways. The best solution can be tailored to the scenario at hand. Different schemes are described below for obtaining the apariori information.

The apriori information may be obtained from the actual information in any suitable method. For instance, an auto-regression model, where a probability function of a value of bits, P(x), is equal to a sliding window average of that value, can be used to calculate apriori information. For example, $P(x)=\Sigma a^i Info_i$ where the value $a^i$ in the range (0,1) represents a forgetting factor, and $Info_i$ is the information transmitted. The above formulation is just one of different possible averaging functions that could be used. More advanced schemes using multiple poles and zeros can also be used. This averaging could be applied in the linear, LLR, or other domain. Another method that can be used is implementing a conditional probability model. This includes building a state transition from 1 to 0, 1 to 1, 0 to 1, and 0 to 0. These states can be selected as probabilities using some appropriate sliding window. This can be expanded to more data, including points not in the data. This outside data could be long term geometry (SINR values), what information was fed back from other channels (ACK/NACKs, PMI, CQI sent on the PUCCH). Another method that can be used is for an external software to provide the apriori information based on a yet undetermined functionality.

New forward error correction (FEC) schemes that are suitable with this decoding scheme can also be used. The FEC can be configured to take the apriori information into account. Different FEC codes may perform differently with the apriori information. For example, the use of systematic codes is expected to perform worse as the information bits are transmitted directly, reducing the possibility and the entropy transmitted. Thus, the use of non-systematic codes is preferred if apriori information is used at the decoder. However, this is not a requirement.

Table 1 below shows a Long Term Evolution (LTE) control channel, a LTE Format 0, that includes predictable information. For example, the FreqHopping bit is probably the same in 95% of transmissions over time. The Allocation bits may have a probability of 90% to be the same as in the last transmission. The ModCoding bits may fall in one of 3 options (out of 32 options) 90% of the time. The NewData bit has a probability of 90% to be used only when an error occurs. The TPC bits may be 95% unchanged (used or not used). These probabilities can be used as apriori knowledge (e.g., as part of a product code for apriori information) to input in the decoder.

TABLE 1

LTE Format 0

| | | |
|---|---|---|
| DCIFormat | | 'Format0' |
| FreqHopping | 1-bit | PUSCH frequency hopping flag |
| Allocation | variable | Resource block assignment/allocation |
| ModCoding | 5-bits | Modulation, coding scheme and redundancy version |
| NewData | 1-bit | New data indicator |
| TPC | 2-bits | PUSCH TPC command |
| CShiftDMRS | 3-bits | Cyclic shift for DM RS |
| CQIReq | 1-bit | CQI request |
| TDDIndex | 2-bits | For TDD config 0, this field is the Uplink Index. For TDD Config 1-6, this field is the Downlink Assignment Index. Not present for FDD. |
| CRC | 16-bits | |

Figure 2A:
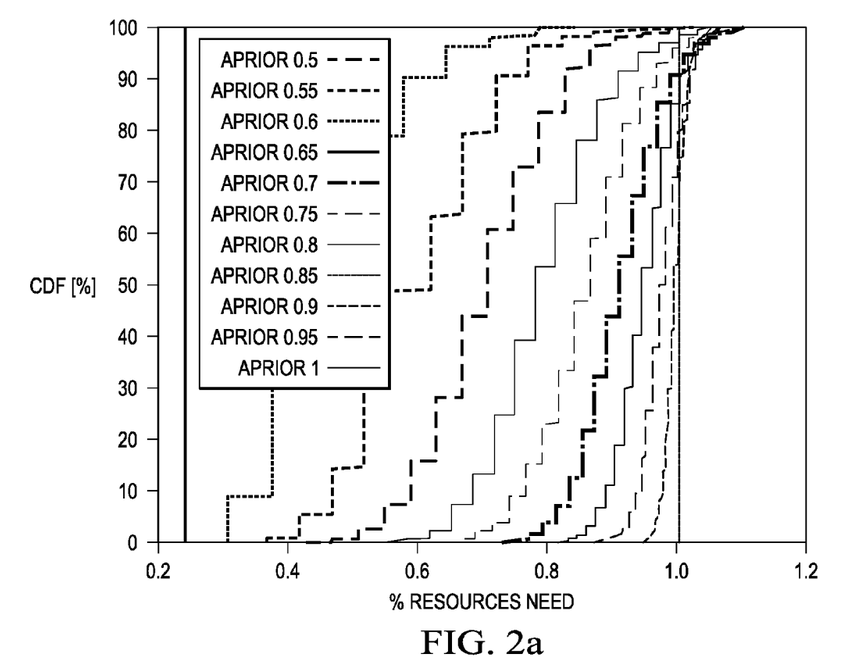
FIGS. 2a and 2b illustrate the effect of using apriori knowledge for decoding control data on the gain in rate of transmitted bits.
Figure 2B:
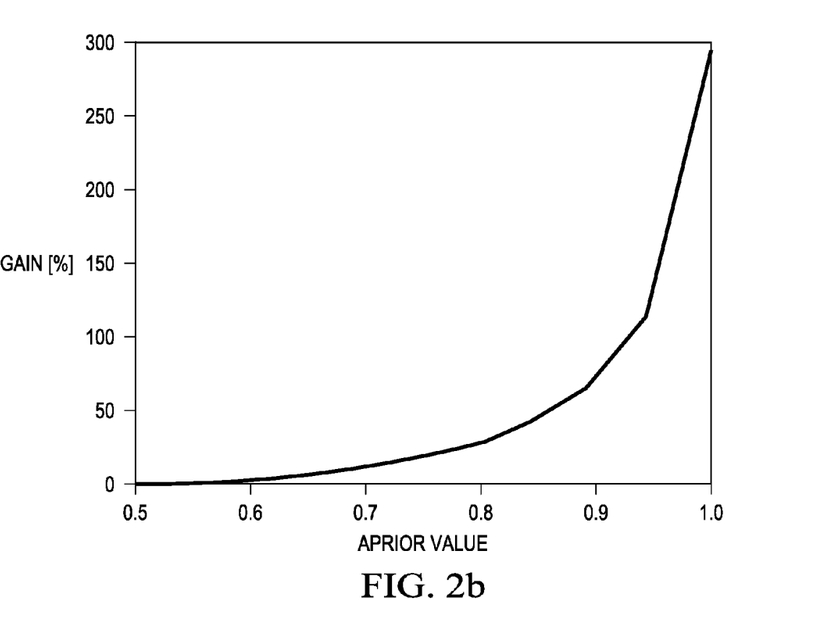

FIGS. 2a and 2b show the effect of using apriori knowledge for decoding control data on gain in rate of transmitted bits. FIG. 2a shows the percentage cumulative distribution function (CDF) versus the percentage resource needed for transmitting the LTE Format 0 shown above, using different amounts of apriori knowledge in the decoder. The legend shows apriori values from 0.5 (or 50% apriori knowledge of the bits) to 1 (or 100% apriori knowledge of the bits). The CDFs show that less resource are needed as more apriori information is known, in other words as more of the control information is predictable. The values in FIG. 2a are calculated from simulation assuming that each bit is independent with known distribution. In practice, the likelihood of one field being predictable is linked to the likelihood of others being predictable. Thus, larger state probabilities that model this interdependency would aid in this performance. FIG. 2b shows the percentage gain in the transmitted rate vs. the average apriori value for all bits considered in combination. The curve in FIG. 2B shows that the gain increases with higher apriori value.

Figure 3:
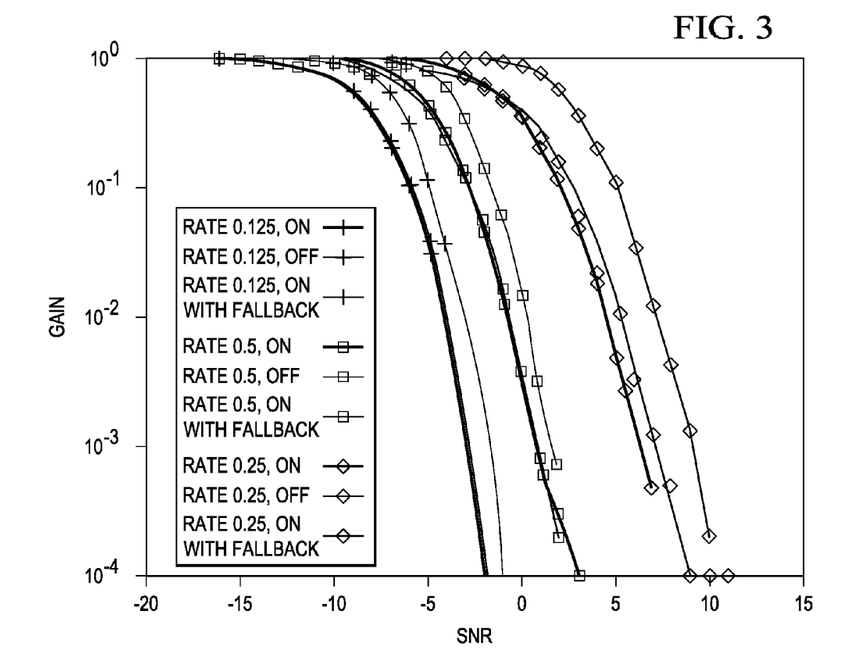
FIG. 3 illustrates obtained gain values vs. signal to noise ratios (SNRs) using apriori knowledge for decoding control data at various data rates.
Figure 4:
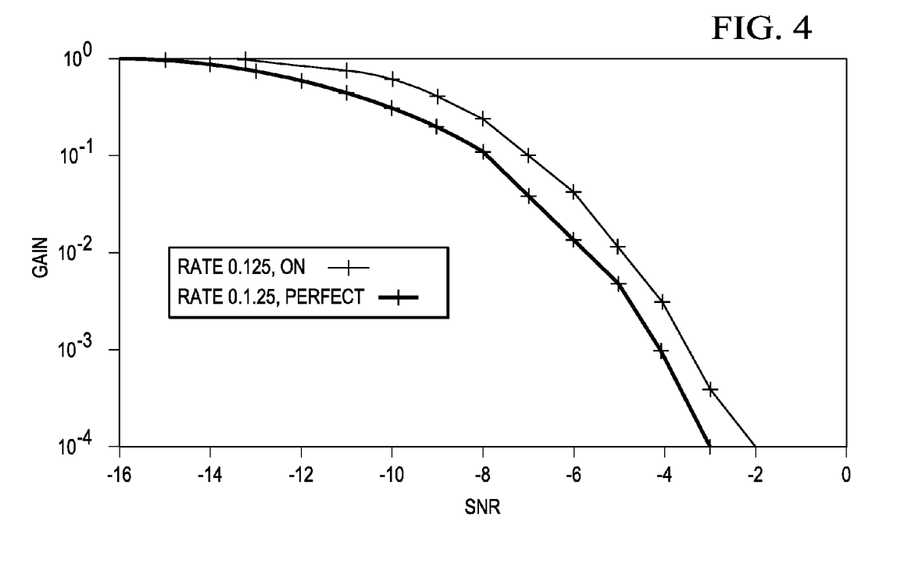
FIG. 4 illustrates obtained gain values vs. signal to noise ratios (SNRs) using apriori knowledge for decoding control data according to another scheme.

FIG. 3 shows simulated gain values vs. signal to noise ratios (SNRs) using apriori knowledge for decoding control data at various data rates. The simulated results are for a Physical Downlink Control Channel (PDCCH). The results are obtained using a link level simulator. The gains are in the order of 1 dB, at the cost of increase in marginal complexity. Theoretically, the gains may be around 1.5 dB at low SNRs (where rate is close to SNR), and larger at higher SNRs. The assignment, Precoding Matrix Indicator (PMI), and new data indicator fields are obtained from a simulated scheduler. Other fields were not used and set to zero. The CRC used was 24 bits (rather than 16 bits used in PDCCH), which reduces the overall performance of decoding scheme using the apriori knowledge. The MCS field was modeled as grey mapping and not optimized beyond the scheme used, which also reduces performance of the scheme. The new data indicator was similarly modeled. MCS adaptation was not applied, which improves the performance of the scheme at low Block Error Rate (BLER), since various error cases are predictable. FIG. 4 also shows obtained gain values vs. signal to noise ratios (SNRs) using apriori knowledge based decoding according to another scenario. In this scenario, a transmitting base station or eNB deliberately assigns predictable data so that a UE can better decode the PDCCH. This allows the transmit range extension of the PDCCH with minimal standard change.

The scheme can also be implemented for other communications channels, such as a Physical Uplink Shared Channel (PUSCH) where data can be predicted. Another channel where the scheme can be used is the Physical Downlink Shared Channel (PDSCH) where some data may be known (e.g., TCP headers). The scheme can be used for WiFi control channels where headers are partially known. Examples of other suitable channels where the scheme can be implemented include the Physical Broadcast Channel (PBCH), and the Downlink Shared Channel (DSCH) where various fields are highly predictable.

Due to the nature of information predictability, it is difficult to accurately encode a predictor which will work well in all cases. Thus in many situations, it is desirable for the predictor to be separate from the decoder, which allows for the predictor to be highly specialized to the specific use case. One way for this to be done is to have the apriori information provided by an 'external' software/hardware agent, which is configured separately.

Figure 5:
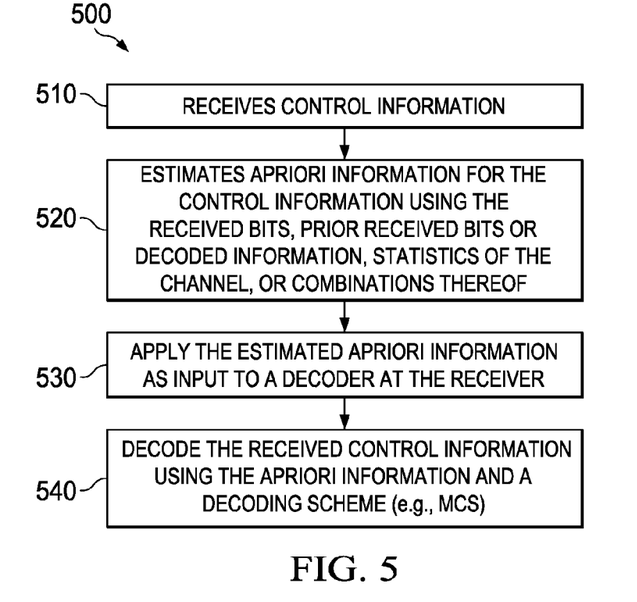
FIG. 5 illustrates an embodiment of a method for using apriori information to decode transmitted information.

FIG. 5 shows an embodiment of a method 500 for using apriori information to decode transmitted information. At step 510, a receiver, e.g., at a UE or BS, receives control information. At step 520, the receiver estimates apriori information for the control information using the received bits, prior received bits or decoded information, statistics of the channel, or combinations thereof. At step 530, the estimated apriori information is applied as input to a decoder at the receiver. At step 540, the decoder decodes the received control information using the apriroi information and a decoding scheme (e.g., MCS). In an embodiment, the transmitter indicates to the receiver, e.g., via a transmission behavior, whether the information is transmitted at a higher rate to trigger the receiver to use apriori information in decoding. For instance, the transmitter keeps track of apriori information for transmissions (over time). If the apriroi information changes, the transmitter changes its transmission behavior, e.g., uses a different MCS. The receiver may switch to using the apriori information based scheme for a given MCS or higher. If the MCS is lower than a threshold or is reduced, then the receiver can stop using the apriori information to decode the control channel. Partial steps could also be applied where a fraction of the apriori information is used, depending on the MCS level used. Although the method 500 refers to MCS, other scheme to effect the reliability of the channel can also be used, such as power control, interference shaping, and resource assignment.

Figure 6:
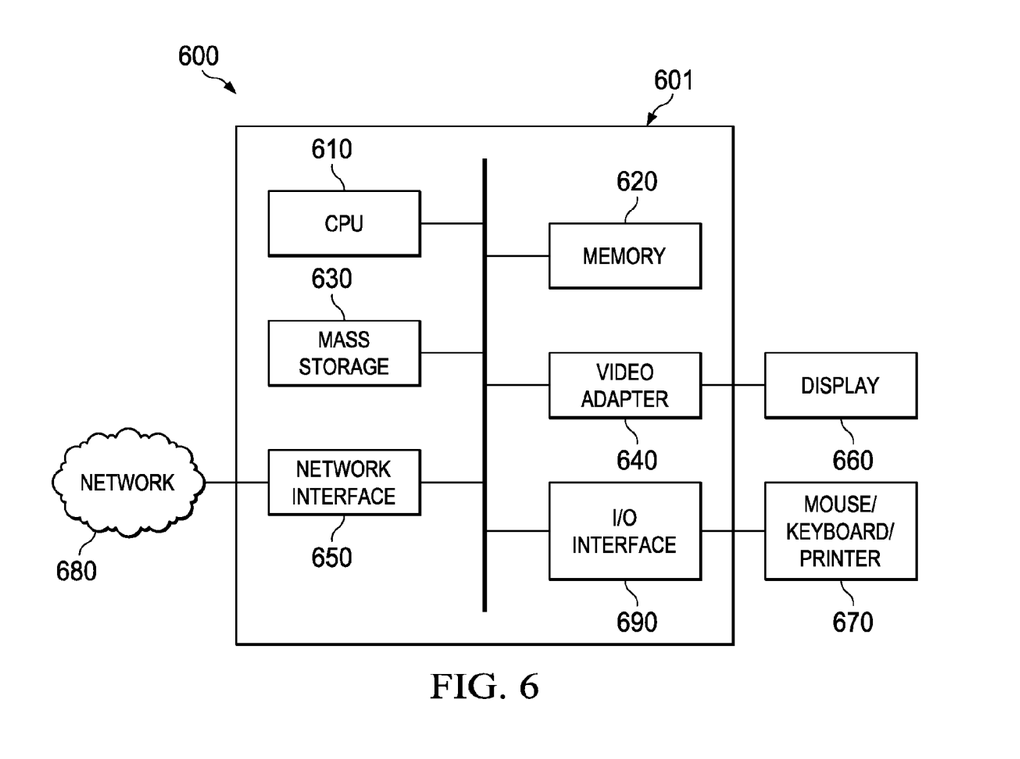
FIG. 6 is a diagram of a processing system that can be used to implement various embodiments.

FIG. 6 is a block diagram of an exemplary processing system 600 that can be used to implement various embodiments. The processing system is part of a communications system, such as at the central office or a network component or node (e.g., a router). The processing system 600 may comprise a processing unit 601 equipped with one or more input/output devices, such as a speaker, microphone, mouse, touchscreen, keypad, keyboard, printer, display, and the like. The processing unit 601 may include a central processing unit (CPU) 610, a memory 620, a mass storage device 630, a video adapter 640, and an Input/Output (I/O) interface 690 connected to a bus. The bus may be one or more of any type of several bus architectures including a memory bus or memory controller, a peripheral bus, a video bus, or the like.

The CPU 610 may comprise any type of electronic data processor. The memory 620 may comprise any type of system memory such as static random access memory (SRAM), dynamic random access memory (DRAM), synchronous DRAM (SDRAM), read-only memory (ROM), a combination thereof, or the like. In an embodiment, the memory 620 may include ROM for use at boot-up, and DRAM for program and data storage for use while executing programs. The mass storage device 630 may comprise any type of storage device configured to store data, programs, and other information and to make the data, programs, and other information accessible via the bus. The mass storage device 630 may comprise, for example, one or more of a solid state drive, hard disk drive, a magnetic disk drive, an optical disk drive, or the like.

The video adapter 640 and the I/O interface 690 provide interfaces to couple external input and output devices to the processing unit. As illustrated, examples of input and output devices include a display 660 coupled to the video adapter 640 and any combination of mouse/keyboard/printer 670 coupled to the I/O interface 690. Other devices may be coupled to the processing unit 601, and additional or fewer interface cards may be utilized. For example, a serial interface card (not shown) may be used to provide a serial interface for a printer.

The processing unit 601 also includes one or more network interfaces 650, which may comprise wired links, such as an Ethernet cable or the like, and/or wireless links to access nodes or one or more networks 680. The network interface 650 allows the processing unit 601 to communicate with remote units via the networks 680. For example, the network interface 650 may provide wireless communication via one or more transmitters/transmit antennas and one or more receivers/receive antennas. In an embodiment, the processing unit 601 is coupled to a local-area network or a wide-area network for data processing and communications with remote devices, such as other processing units, the Internet, remote storage facilities, or the like.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method by a receiver for utilizing apriori information in a decoder, the method comprising:
    receiving, at an input of the receiver, information associated with a control channel;
    determining the apriori information in accordance with the received information and previously received information associated with the control channel; and
    decoding the received information at the decoder using the determined apriori information as probability information.

2. The method of claim 1, wherein the received information is decoded using a decoding scheme in accordance with a transmission rate of the received information.

3. The method of claim 1, wherein the apriori information associated with the received information is determined in accordance with at least one of bits in the received information, prior received channel bits, prior decoded channel bits, and channel statistics.

4. The method of claim 1 further comprising:
    receiving subsequent information;
    detecting change in transmission behavior of the subsequent information in comparison to the received information; and
    decoding the subsequent information without determining and using apriori information for the subsequent information.

5. The method of claim 4, wherein the change in transmission behavior is a reduction of a modulation and coding scheme (MCS) in comparison to the received information.

6. The method of claim 4, wherein the change in transmission behavior is a change of a modulation and coding scheme (MCS) in comparison to the received information.

7. The method of claim 1, wherein the apriori information is determined and provided to the decoder upon detecting a higher modulation and coding scheme (MCS) for the received information in comparison to previously received information.

8. The method of claim 1, wherein determining the apriori information comprises:
    calculating probabilities corresponding to the received information; and
    applying weights to bits in decoding the received information, wherein the weights are log likelihood ratios (LLRs).

9. The method of claim 1, wherein the apriori information is determined using an auto-regression model where a probability function of a value of bits is equal to a sliding window average of the value.

10. The method of claim 1, wherein the apriori information is determined using a conditional probability model comprising a plurality of bit transition states, and wherein the bit transition states are selected as probabilities using an appropriate sliding window.

11. The method of claim 1, wherein the apriori information includes a probability value of predictable information.

12. The method of claim 1, wherein the received information has a transmission rate of information bits to transmitted bits that is greater than 1.

13. The method of claim 1, wherein the apriori information is determined and provided to the decoder upon detecting a change in a modulation and coding scheme (MCS) for the received information in comparison to previously received information.

14. The method of claim 1, wherein the information, as received, is encoded into bits and fields excluding the apriori information.

15. The method of claim 14, wherein the received information includes forward error correction (FEC) bits in accordance with the apriori information and with the bits and fields of the information.

16. The method of claim 1, wherein the information, as received, is encoded into bits and fields by excluding a portion of the information predictable based on the apriori information.

17. The method of claim 16, wherein the portion of the information predictable based on the apriori information includes at least one of a bit for indicating frequency hopping in transmission, a field for resource block allocation, a field for indicating a modulation and coding scheme in the transmission, a bit for indicating new data in the transmission, and a field for indicating transmission power control (TPC).

18. The method of claim 17, wherein the apriori information includes probabilities values for matching the bits and fields in the portion predictable based on the apriori information to previously transmitted information.

19. A network component for utilizing apriori information, the network component comprising:

at least one processor including a decoder; and
a non-transitory computer readable storage medium storing programming for execution by the processor, the programming including instructions to:
  receive, at an input, information associated with a control channel;
  determine the apriori information in accordance with the received information and previously received information associate with the control channel; and
  decode the received information at the decoder using the determined apriori information as probability information.

20. The network component of claim 19, wherein the received information corresponds to bits and fields in a Long Term Evolution (LTE) Format 0, a Physical Downlink Control Channel (PDCCH), a Physical Uplink Shared Channel (PUSCH), a Physical Downlink Shared Channel (PDSCH), a Physical Broadcast Channel (PBCH), a Downlink Shared Channel (DSCH), or a wireless local area network (WLAN) control channel.

21. The network component of claim 19, wherein the network component is a user equipment (UE) or a base station (BS).

* * * * *